United States Patent [19]

Botez

[11] Patent Number: 4,692,925

[45] Date of Patent: Sep. 8, 1987

[54] PHASE-LOCKED LASER ARRAY

[75] Inventor: Dan Botez, Randolph Township, Morris County, N.J.

[73] Assignee: RCA Corporation, Princeton, N.J.

[21] Appl. No.: 681,206

[22] Filed: Dec. 13, 1984

[51] Int. Cl.⁴ .............................................. H01S 3/19
[52] U.S. Cl. ..................................... 372/46; 372/48; 372/50
[58] Field of Search ................ 372/46, 48, 50; 357/17

[56] References Cited

U.S. PATENT DOCUMENTS

| | | | |
|---|---|---|---|
| 3,753,801 | 8/1973 | Lockwood et al. | 148/171 |
| 4,347,486 | 8/1982 | Botez | 372/46 |
| 4,385,389 | 5/1983 | Botez | 372/48 |

OTHER PUBLICATIONS

"High Power Phase-locked Arrays of Index-guided Diode Lasers", D. Botez et al., Applied Physics Letter, Dec. 15, 1983.
"Fundamental Mode Oscillation of a Buried Ridge Waveguide Laser Array", S. Mukai et al., Applied Physics Letter, Oct. 15, 1984.
"Coupled-mode Analysis of Phase-locked Injection Laser Arrays", J. K. Butler et al., Applied Physics Letter, Feb. 1, 1984.
"Single Longitudinal Mode Operation of High Power Multiple-stripe Injection Lasers", D. E. Ackley et al., Applied Physics Letter, Jan. 15, 1983.

*Primary Examiner*—James W. Davie
*Attorney, Agent, or Firm*—Joseph S. Tripoli; Harley R. Ball

[57] ABSTRACT

A phase-locked laser array comprises a body of semiconductor material having means for defining a plurality of substantially parallel lasing zones which are spaced an effective distance apart so that the modes of the adjacent lasing zones are phase-locked to one another. One of the array electrodes comprises a plurality of electrical contacts to the body between the lasing zones. These contacts provide an enhanced current density profile and thus an increase in the gain in the regions between the lasing zones so that zero degree phase-shift operation between adjacent lasing zones is achievable.

6 Claims, 1 Drawing Figure

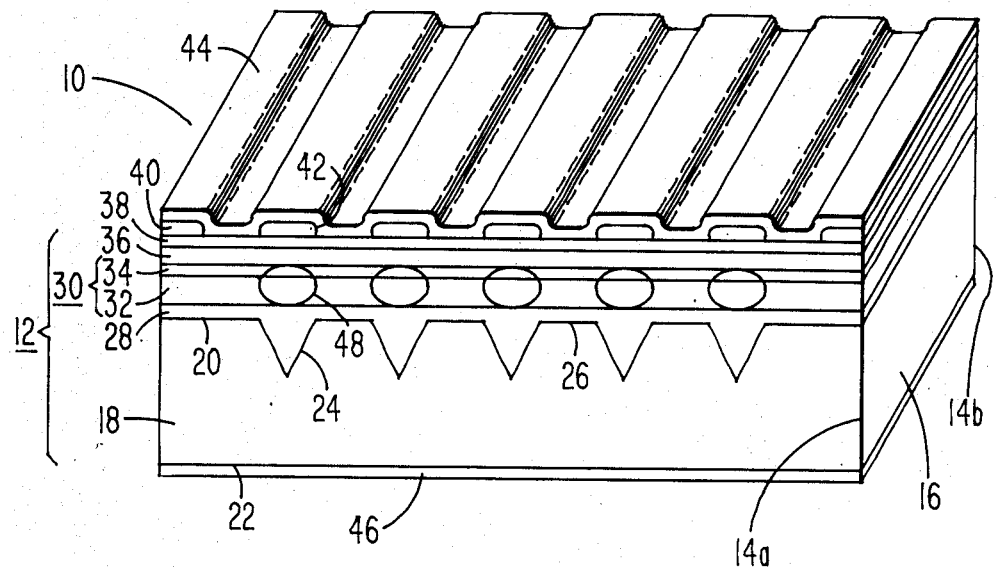

PHASE-LOCKED LASER ARRAY

The invention described herein was made in the performance of work under NASA Contract No. NAS 1-17441 and is subject to the provisions of Section 305 of the National Aeronautics and Space Act of 1958 (72 Stat. 435; 42 U.S.C. 2457).

The invention relates to a phase-locked semiconductor laser array having a single lobe far field radiation pattern.

BACKGROUND OF THE INVENTION

A semiconductor laser typically comprises a body of semiconductor material including a cavity region between cladding regions of opposite conductivity type. To increase the output power, the cavity region typically includes a guide layer in addition to the active layer so that light generated in the active layer propagates in both the active and guide layers thereby forming a larger beam at the emitting facet of the body. The cavity region also restricts oscillation in the transverse direction, the direction perpendicular to the plane of the layers, to the fundamental optical mode. In the lateral direction, the direction in the plane of the cavity region and perpendicular to the direction of light propagation, structural variations in the body produce an optical waveguide which in turn restricts the oscillation to the fundamental lateral optical mode. Lasers incorporating transverse and lateral waveguides, such as those disclosed by Botez in U.S. Pat. No. 4,347,486, incorporated herein by reference, may have output powers in excess of 40 milliwatts in the fundamental lateral and transverse mode. To further increase the output power monolithic arrays of phase-locked lasers which operate with output powers up to about 80 milliwatts have been fabricated. However, the output radiation pattern of these devices typically comprises two lobes equally spaced in angle about the normal to the emitting end face of the array. This output pattern is undesirable from a systems viewpoint because only about one half of the emitted light can be used in systems with beam forming optics, thereby negating the advantage of these arrays. Thus it would be desirable to have a phase-locked laser array in which the radiation pattern consisted primarily of a single lobe, preferably normal to the emitting end face of the array.

SUMMARY OF THE INVENTION

A phase-looked laser array oomprises a body of semiconductor material having means for defining a plurality of substantially parallel, phase-locked lasing zones. One of the array electrodes comprises a plurality of electrical contacts to the body over the regions between the lasing zones so that the current density between the zones is enhanced.

BRIEF DESCRIPTION OF THE DRAWING

The sole FIGURE is a perspective view of a laser array of the invention.

DESCRIPTION OF PREFERRED EMBODIMENTS

In the FIGURE a laser array 10 incorporating the invention comprises a body 12 of single-crystalline semiconductor material having a pair of reflecting end faces 14a and 14b and sidewalls 16 substantially perpendicular to and extending between the end faces 14. At least one of these end faces 14 is partially transparent so that laser light may be emitted from the array 10. The semiconductor body 12 includes a substrate 18 having first and second major surfaces 20 and 22, respectively. The first major surface 20 includes a plurality of spaced, substantially parallel channels 24 with lands 26 therebetween. A first cladding layer 28 overlies the major surface 20 and the lands 26 and fills the channels 24. A cavity region 30 overlies the first cladding layer 28 and comprises a guide layer 32 overlying the first cladding layer 28 and an active layer 34 overlying the guide layer 32. A second cladding layer 36 overlies the cavity region 30 and a capping layer 38 overlies the second cladding layer 36. An electrically insulating layer 40, having openings 42 extending therethrough, overlies the capping layer 38. A first electrode 44 overlies the electrically insulating layer 40 and the capping layer 38 in the openings 42. A second electrode 46 overlies the second major surface 22. Lasing zones 48, denoted by the ovals in the cavity region 30, extend between the end faces 14 and are centered over the channels 24. The zones 48 are defined by lateral variations of the local effective transverse refractive index arising from the presence of the channels 24.

While the principles of the invention have been described in relation to the laser 10, it is to be understood that these principles are equally applicable to any laser array having a plurality of spaced lasing zones 48 extending between the end faces 14 and defined by one or more structural features of the array 10. Preferably, these structural features have uniform width in the lateral direction thereby providing lasing zones 48 which will oscillate in nearly the same lateral and transverse optical mode. For a particular array, including the type and shape of the optical guides and the shape and curvature of the layers through which the coupling occurs, there will be a maximum spacing between adjacent lasing zones 48 over which the coupling strength will be sufficient to phase-lock the lasing zones 48 to one another. The center-to-center spacing between any pair of adjacent lasing zones 48 must then be less than this maximum distance.

The alloys used for the different layers are chosen such that the bulk refractive index of the material comprising the active layer 34 is greater than that of the guide layer 32 which in turn is greater than that of the cladding layers 28 and 36. The array 10 may be formed using materials such as GaAs and AlGaAs alloys which have the requisite refractive index differences. Alternatively, alloys of other Group III and V elements such as In, P, and Sb may be used.

The substrate 18 and the first cladding layer 28 are of one conductivity type and the second cladding layer 36 and the capping layer 38 are of the opposite conductivity type. The guide layer 32 is preferably positioned between the first cladding layer 28 and the active layer 34, as shown in the FIGURE, and, in this case, has the same conductivity type as the first cladding layer 28. In some applications, the guide layer 32 may be positioned between the active layer 34 and the second cladding layer 36 in which case the guide layer 32 has the same conductivity type as the second cladding layer 36. In other applications, the guide layer 32 may not be present.

The laser array 10 of the invention may be fabricated using well-known liquid-phase epitaxy techniques such as those disclosed by Lockwood et al. in U.S. Pat. No. 3,753,801, by Botez in U.S. Pat. No. 4,347,486, both of which are incorporated herein be referenced, and by Botez et al. in Applied Physics Letters 43, No. 12, 1096-1098 (1983).

The substrate 18 is preferably composed of N-type GaAs having a first major surface 20 which is parallel to or slightly misoriented from a [100] crystallographic plane. The channels 24, if present, may be formed using standard photolithographic and etching techniques as disclosed by Botez in U.S. Pat. No. 4,347,486 or, preferably, by the technique disclosed by Botez et al., referred to above. The maximum center-to-center spacing between the channels 24 is preferably about 10 micrometers ($\mu$m) with a minimum depth of about 1 $\mu$m and a typical channel width at the surface 20 between about 2 and 4 $\mu$m. It is to be understood that the substrate 18 is also meant to include an epitaxial buffer layer on the surface 20 which typically has the same composition as the substrate 18 and in which the channels 24 are formed.

The first cladding layer 28 is typically between about 0.2 and 0.5 $\mu$m thick, preferably about 0.4 $\mu$m thick, over the lands 26 and is typically composed of $Al_r Ga_{1-r}As$ where r is between about 0.2 and 0.45 and preferably between about 0.25 and 0.40. The guide layer 32 is typically between about 0.3 and 0.6 $\mu$m thick and is composed of $Al_x Ga_{1-x}As$ where x is between about 0.15 and 0.30. The active layer 34 is typically between about 0.05 and 0.15 $\mu$m thick and is typically composed of $Al_y Ga_{1-y}As$ where y is between about 0.0 and 0.15 and preferably between about 0.03 and 0.12. The second cladding layer 36 is typically between about 0.8 and 1.5 $\mu$m thick and is typically composed of $Al_z Ga_{1-z}As$ where z is between about 0.25 and 0.45 and preferably between about 0.3 and 0.35. The capping layer 38 is typically between about 0.3 and 1.0 $\mu$m thick and is typically composed of GaAs which is used to facilitate electrical contact with the underlying layers.

The first electrode 44 comprises a plurality of spaced apart, substantially parallel, electrically connected contacts to the capping layer 38 which extend between the end faces 14 over the lands 36 between the channels 24. In general the contacts are centered over the regions between the built-in waveguides but may slightly overlap onto the body surface over the waveguides. The contacts cannot extend substantially over the waveguides since the resulting broad-area like contact is known to produce, in general, a multi-lobed far field radiation pattern. Current flow from these contacts spreads laterally to pump the lasing zones 48 over the channels 24 to provide lasing action therein. A portion of the current also flows directly to the underlying lands 26 thereby partially pumping the portions of the array 10 between the lasing zones 48. Thus, the current density profile and consequently, the gain, is increased between the lasing zones 48. This enhanced gain will offset the optical absorption between the lasing zones 48, making zero degree phase-shift operation between adjacent lasing zones 48 possible.

In the FIGURE an electrically insulating layer 40 with openings 42 confine the electrical current to the surface areas over the lands 26. Alternative means for confining the electrical current include a plurality of electrically conducting stripes on the surface of the body 12, proton-bombarded regions of high resistivity or reversed biased semiconductor P-N junctions.

The electrically insulating layer 40 is typically composed of silicon dioxide which is deposited by pyrolytic decomposition of a silicon-containing gas, such as silane, in oxygen or water vapor. The openings 42 are formed using standard photolithographic masking and etching processes. The first electrode 44, preferably composed of sequentially evaporated titanium, platinum and gold, is then deposited onto the capping layer 38 where it is exposed in the openings 42. The second electrode 46 is formed by sequential vacuum evaporation of germanium, gold, nickel and gold layers, followed by a sintering step.

I claim:

1. In a phase-locked laser array including a body of semiconductor material having therein a cavity region and means for defining a plurality of substantially parallel lasing zones in said cavity region, said zones being spaced an effective distance apart so that the modes of oscillation in adjacent lasing zones are phase-locked to one another, and first and second electrodes on said body;

the improvement wherein said first electrode comprises a plurality of spaced apart electrically connected electrical contacts to said body over the regions between said lasing zones.

2. The array of claim 1 wherein said body includes a substrate and said means for defining a plurality of substantially parallel lasing zones comprises a plurality of substantially parallel channels with lands therebetween in the surface of said substrate and said plurality of electrical contacts to said body overlie the lands between the channels.

3. The array of claim 2 wherein said body further comprises a first cladding layer overlying said substrate and filling said channels, said cavity region overlying said first cladding layer and a second cladding layer overlying said cavity region and wherein said first electrode overlies said second cladding layer.

4. The array of claim 3 wherein said cavity region comprises a guide layer overlying said first cladding layer and an active layer overlying said guide layer.

5. The array of claim 4 further comprising a capping layer overlying said second cladding layer and said first electrode overlying said capping layer.

6. The array of claim 5 further comprising an electrically insulating layer overlying said capping layer and having a plurality of substantially parallel openings therethrough extending between the end faces over said lands and wherein said electrical contacts contact the surface of said capping layer in the openings in said electrically insulating layer.

* * * * *